(12) United States Patent
Oyama et al.

(10) Patent No.: US 11,688,678 B2
(45) Date of Patent: Jun. 27, 2023

(54) WIRING BOARD AND SEMICONDUCTOR DEVICE

(71) Applicant: KIOXIA CORPORATION, Tokyo (JP)

(72) Inventors: Yukifumi Oyama, Kanagawa (JP); Mitsumasa Nakamura, Chiba (JP); Yuichi Sano, Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 6 days.

(21) Appl. No.: 17/005,575

(22) Filed: Aug. 28, 2020

(65) Prior Publication Data
US 2021/0296223 A1    Sep. 23, 2021

(30) Foreign Application Priority Data

Mar. 17, 2020 (JP) .............................. JP2020-046216

(51) Int. Cl.

| | |
|---|---|
| *H01L 23/525* | (2006.01) |
| *H01L 23/522* | (2006.01) |
| *H01L 23/498* | (2006.01) |
| *H01L 23/552* | (2006.01) |
| *H01L 25/18* | (2023.01) |
| *H01L 23/00* | (2006.01) |

(52) U.S. Cl.
CPC ...... *H01L 23/49838* (2013.01); *H01L 23/552* (2013.01); *H01L 24/32* (2013.01); *H01L 24/48* (2013.01); *H01L 25/18* (2013.01); *H01L 2224/32145* (2013.01); *H01L 2224/48225* (2013.01)

(58) Field of Classification Search
CPC .......................... H01L 23/552; H01L 23/5225
See application file for complete search history.

(56) References Cited

U.S. PATENT DOCUMENTS

| | | | |
|---|---|---|---|
| 6,510,545 B1 * | 1/2003 | Yee ..................... | H01L 23/5225 716/126 |
| 7,002,253 B2 | 2/2006 | Katsura et al. | |
| 7,894,199 B1 * | 2/2011 | Chang .................... | H01L 24/73 361/760 |
| 2006/0180905 A1 * | 8/2006 | Zeng ................. | H01L 23/49822 257/E23.079 |
| 2012/0163413 A1 * | 6/2012 | Kim ....................... | G01K 13/10 374/152 |

(Continued)

FOREIGN PATENT DOCUMENTS

| | | | |
|---|---|---|---|
| JP | 2001-250825 A | 9/2001 | |
| JP | 4919475 B2 | 4/2012 | |
| JP | 2018137486 A * | 8/2018 | ............. H01L 23/00 |

*Primary Examiner* — Michele Fan
(74) *Attorney, Agent, or Firm* — Foley & Lardner LLP

(57) ABSTRACT

A wiring board includes a first wiring layer, a high-speed wiring disposed in the first wiring layer, a second wiring layer, and a signal wiring disposed in the second wiring layer. The signal wiring transmits a signal slower than that through the high-speed wiring. A third wiring layer between the first and second wiring layers includes a power supply wiring and/or a ground wiring, which is not disposed in a portion where a land of the first wiring layer and the signal wiring do not overlap. The power supply wiring and/or the ground wiring overlap the signal wiring in a portion where the land of the first wiring layer and the signal wiring overlap each other.

17 Claims, 4 Drawing Sheets

(56) References Cited

U.S. PATENT DOCUMENTS

| | | | | |
|---|---|---|---|---|
| 2014/0104802 A1* | 4/2014 | Oikawa | ............. | H01L 23/49827 |
| | | | | 361/783 |
| 2014/0252632 A1* | 9/2014 | Barth | .................. | H01L 25/0657 |
| | | | | 257/773 |
| 2015/0011023 A1* | 1/2015 | Allen | ...................... | H01L 22/12 |
| | | | | 438/5 |
| 2017/0229407 A1* | 8/2017 | Zu | ...................... | H01L 23/49838 |
| 2017/0235397 A1* | 8/2017 | Saitou | ................ | G02F 1/134309 |
| | | | | 345/174 |
| 2018/0026019 A1* | 1/2018 | Tao | ..................... | H01L 23/3128 |
| | | | | 257/668 |
| 2019/0318990 A1* | 10/2019 | Nakagawa | .......... | H01L 23/5226 |

* cited by examiner

WIRING BOARD AND SEMICONDUCTOR DEVICE

CROSS-REFERENCE TO RELATED APPLICATION(S)

This application is based upon and claims the benefit of priority from Japanese Patent Application No. 2020-046216, filed Mar. 17, 2020, the entire contents of which are incorporated herein by reference.

FIELD

Embodiments described herein relate generally to a wiring board and a semiconductor device.

BACKGROUND

A semiconductor package such as a semiconductor storage device having a structure in which a plurality of semiconductor chips are stacked and sealed in one package is put into practical use in order to achieve miniaturization, higher speed, higher functionality, and the like, of the semiconductor device. The semiconductor storage device has, for example, a structure in which a controller chip is buried and adhered to a wiring board by a film on device (FOD) material, and memory chips are stacked in multiple stages on the FOD material.

In the semiconductor package as described above, a multilayer wiring board in which a plurality of wiring layers are formed is used as the wiring board. However, it is required to reduce the influence of noise between wirings of the respective wiring layers. In order to meet such a demand, a ground wiring is disposed between the wiring layers to serve as a noise shield wiring.

However, in a wiring board provided with a high-speed wiring such as peripheral component interconnect express (PCIe), there is a problem that capacitive coupling between the noise shield wiring such as the ground wiring and a high-speed wiring becomes large and electrical characteristics deteriorate.

DETAILED DESCRIPTION

Figure 1:
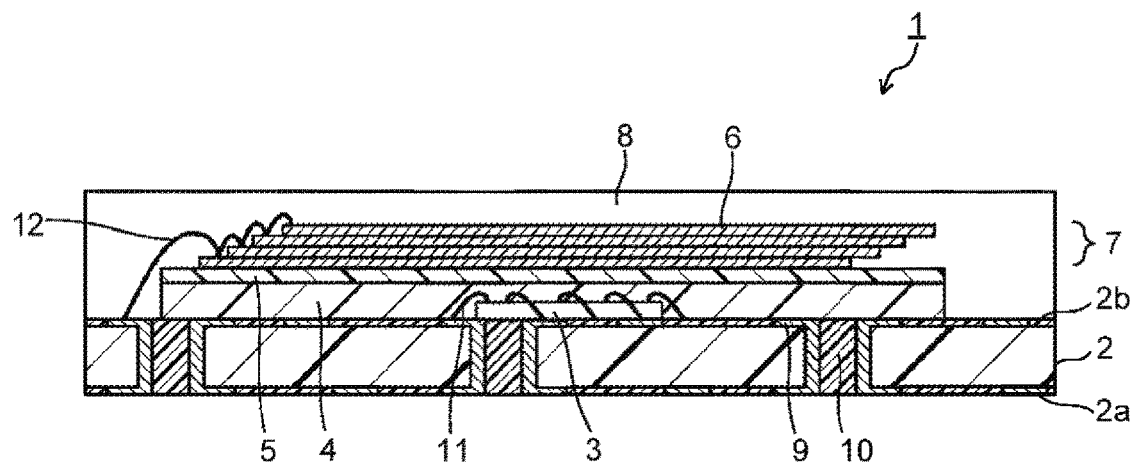
FIG. 1 is a cross-sectional view illustrating a configuration of a semiconductor device according to at least one embodiment.

At least one embodiment provides a wiring board and a semiconductor device capable of preventing capacitive coupling between wiring layers while reducing the influence of noise therebetween.

In general, according to at least one embodiment, there is provided a wiring board including a first wiring layer, a high-speed wiring disposed in the first wiring layer, a second wiring layer which is parallel to the first wiring layer, a signal wiring disposed in the second wiring layer, the signal wiring configured to transmit a signal slower than a signal flowing (transmitted) through the high-speed wiring, and a third wiring layer disposed between the first wiring layer and the second wiring layer and including a power supply wiring and/or a ground wiring provided for noise shielding between the first wiring layer and the second wiring layer, in which the power supply wiring and/or the ground wiring is not disposed in a portion where a land of the first wiring layer and the signal wiring do not overlap, and the power supply wiring and/or the ground wiring overlap the signal wiring in a portion where the land of the first wiring layer and the signal wiring overlap each other.

Hereinafter, description will be made with reference to the drawings according to at least one embodiment. In each drawing, substantially the same components may be denoted by the same reference numerals, and the description thereof may be partially omitted. The drawings are schematic, and the relationship between the thickness and the plane dimension, the thickness ratio of each part, and the like may be different from the actual one. Unless otherwise specified, the terms indicating directions such as up and down in the description may indicate relative directions when a semiconductor chip mounting surface of a substrate, described later, is up, and may differ from an actual direction based on the gravitational acceleration direction.

FIG. 1 is a cross-sectional view illustrating a semiconductor device (semiconductor package) according to the embodiment. A semiconductor package 1 illustrated in FIG. 1 includes a wiring board 2, a first semiconductor chip 3 mounted on the wiring board 2, a first adhesive layer (FOD) 4 that adheres to the wiring board 2 while burying the first semiconductor chip 3, a stacked body 7 of a plurality of third semiconductor chips 6 which is fixed to a second semiconductor chip 5 which does not include an electrode and is adhered to the first adhesive layer 4, and a sealing resin layer 8 provided on the wiring board 2 so as to seal the first semiconductor chip 3, the stacked body 7 of the third semiconductor chips 6, and the like. The second semiconductor chip 5 is a spacer substrate and a silicon wafer is used for the second semiconductor chip 5, but a plate made of resin such as polyimide, glass, or the like may be used as the spacer substrate.

The wiring board 2 is provided with a wiring network configured with, for example, a wiring layer 9 provided on a surface of an insulating resin substrate, an insulating ceramics substrate, or the like, a wiring layer 10 provided inside thereof, and the like. Specific examples of an insulating material include insulating materials such as glass-epoxy resin composite material, glass, polyimide resin, silicon oxide, or silicon nitride. The wiring layers 9 and 10 are made of, for example, a metal material such as copper, a copper alloy, gold, a gold alloy, silver, a silver alloy, aluminum, tungsten, titanium, nickel, and the like. The wiring board 2 has a first surface 2a, which is a surface on which an external terminal is formed, and a second surface 2b, which is a mounting surface for the semiconductor chips 3, 5, and 6.

The first semiconductor chip 3 is mounted on the second surface 2b of the wiring board 2, and the first semiconductor chip 3 is buried in the first adhesive layer (FOD) 4 and adhered to a chip mounting region of the wiring board 2. Examples of the first semiconductor chip 3 include a system LSI chip such as a controller chip for transmitting and receiving a digital signal between a semiconductor memory chip used as the third semiconductor chip 6 and an external device, an interface chip, a logic chip, an RF chip, and the like, but is not limited thereto. In at least one embodiment, a memory of one or more chips and/or external device(s) is non-transitory.

Electrodes (not illustrated) of the first semiconductor chip 3 are electrically connected to the wiring layer 9 of the wiring board 2 via bonding wires 11. By directly mounting the first semiconductor chip 3 such as the controller chip on the wiring board 2, a wiring length between the first semiconductor chip 3 and the wiring board 2 can be shortened. With this configuration, a signal transfer speed between the first semiconductor chip 3 and the wiring board 2 can be improved, and the speed of the semiconductor package 1 can be increased. Furthermore, since the first semiconductor chip 3 is buried in the first adhesive layer 4, mountability of the third semiconductor chip 6 on the wiring board 2 is not deteriorated, and the miniaturization of the package size is not hindered. Accordingly, it is possible to provide the semiconductor package 1 that is compact and compatible with a high-speed device.

An outer profile or outer shape of the first semiconductor chip 3 (e.g., an outer surface area of the first semiconductor chip) such as the controller chip is generally smaller than that of the third semiconductor chip 6 such as the semiconductor memory chip. Therefore, after burying the first semiconductor chip 3 mounted on the wiring board 2 in the first adhesive layer 4, a plurality of third semiconductor chips 6 are stacked and mounted on the first adhesive layer 4. A specific example of the third semiconductor chip 6 is the semiconductor memory chip such as a NAND flash memory, but is not limited thereto. In at least one embodiment, four semiconductor memory chips are stacked and mounted as the third semiconductor chip 6. The number of stacked third semiconductor chips 6 is not limited to four stages.

Of the plurality of third semiconductor chips 6 mounted on the first adhesive layer 4, the third semiconductor chips 6 in the first to fourth stages are stacked in a step-like manner with end portions of the third semiconductor chips 6 arranged in a first direction (the right direction in FIG. 1) being offset so that the electrodes thereof are exposed.

Of the plurality of third semiconductor chips 6, the third semiconductor chip 6 in the first stage is fixed onto the second semiconductor chip 5 that does not include the electrode. The second semiconductor chip 5 is fixed onto the first semiconductor chip 3 via the first adhesive layer 4. For the adhesive layer 4 of the semiconductor package 1, a general adhesive such as a die attach film (DAF) is used. The third semiconductor chip 6 may be fixed to the second semiconductor chip 5 and the third semiconductor chip 6 positioned on the lower side with an adhesive such as the DAF which is not illustrated in FIG. 1. The electrodes (not illustrated) of the third semiconductor chips 6 are electrically connected to the wiring layer 9 of the wiring board 2 via a bonding wire 12. Regarding electrode pads having the same electric characteristics and signal characteristics, the wiring layer 9 of the wiring board 2 and the electrode pads of the plurality of third semiconductor chips 6 can be sequentially connected by the bonding wire 12. That is, the electrodes of the third semiconductor chips 6 from the first stage to the fourth stage are sequentially connected by the bonding wire 12, and the electrode of the third semiconductor chip 6 of the first stage and the wiring layer 9 of the wiring board 2 are connected by the bonding wire 12. The thickness of the semiconductor chip is, for example, 30 μm to 100 μm.

On the second surface 2b of the wiring board 2, the sealing resin layer 8, using an insulating resin such as epoxy resin, is molded, for example, so that the first semiconductor chip 3 and the stacked body 7 of the third semiconductor chips 6 are sealed together with the bonding wires 11 and 12. The semiconductor package 1 of at least one embodiment includes these elements.

Figure 2:
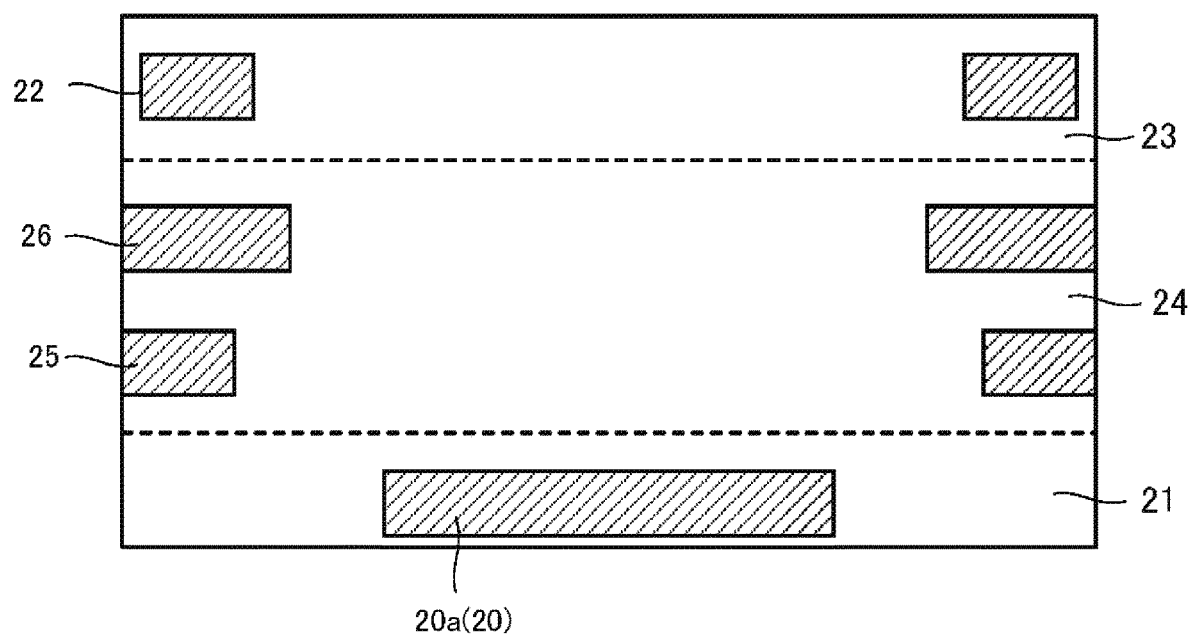
FIG. 2 is a cross-sectional view illustrating a configuration of main parts of a wiring board according to at least one embodiment.
Figure 3:
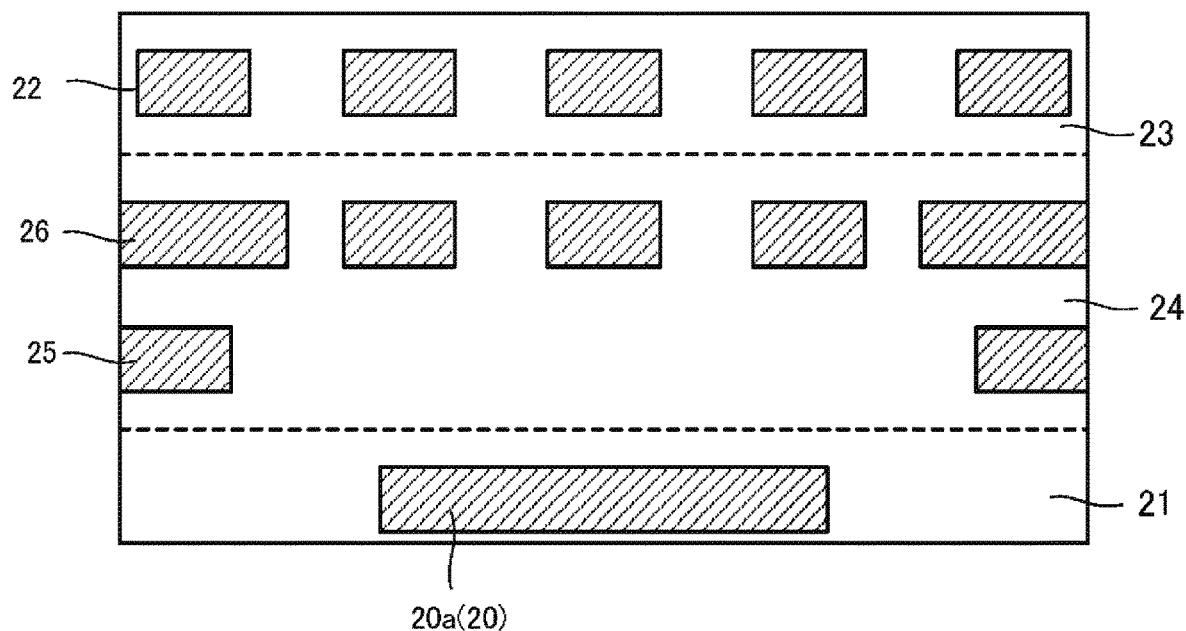
FIG. 3 is a cross-sectional view illustrating a configuration of main parts of the wiring board according to at least one embodiment.

Next, a configuration of the wiring board 2 of the semiconductor package 1 will be described with reference to FIGS. 2 to 6. As illustrated in FIGS. 2 and 3, the wiring board 2 includes a first wiring layer 21, a second wiring layer 23, and a third wiring layer 24. The first wiring layer 21, the second wiring layer 23, and the third wiring layer 24 are substantially parallel to each other.

Figure 5:
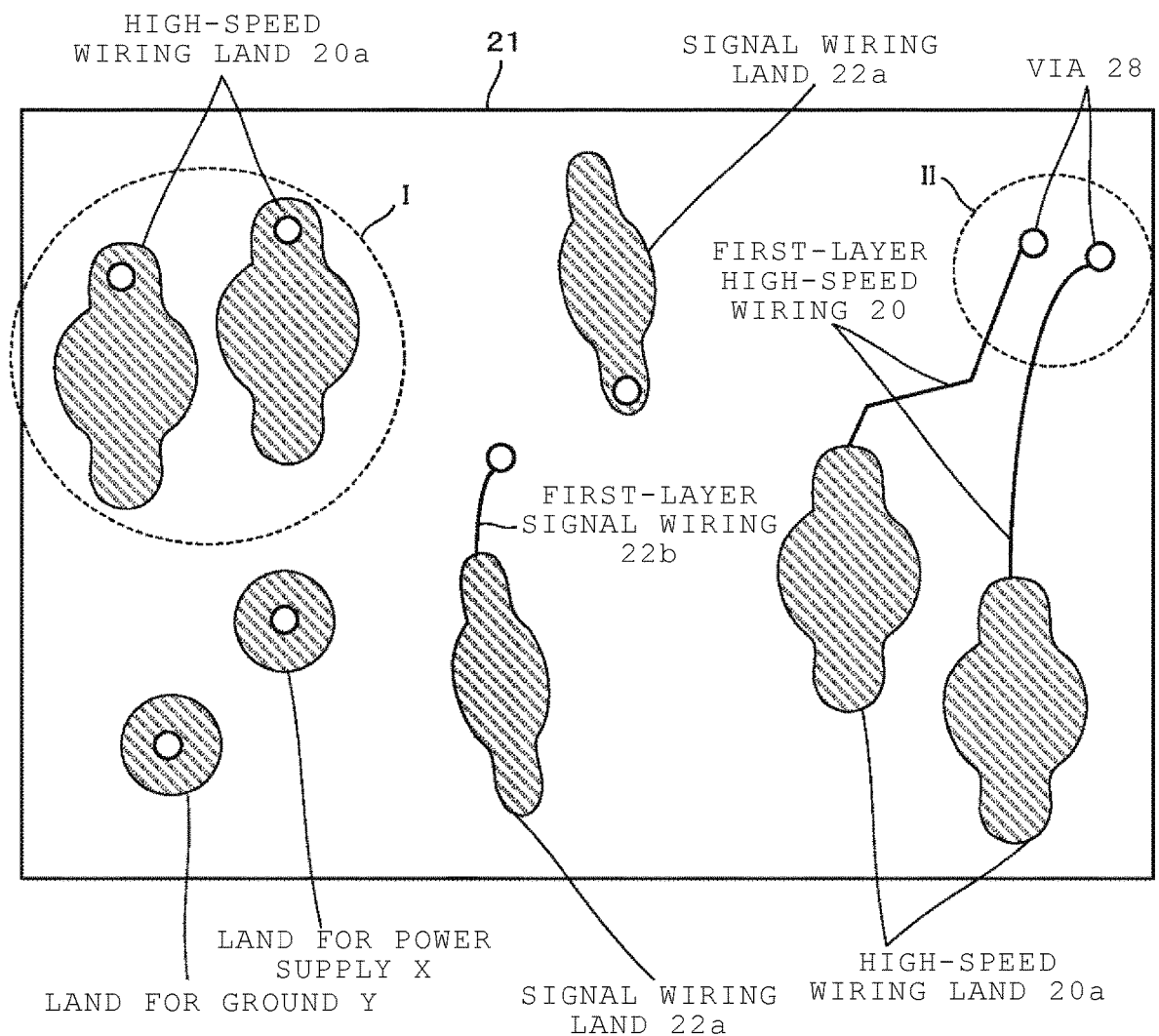
FIG. 5 is a schematic plan view of a wiring pattern of a first wiring layer of the wiring board according to at least one embodiment.

FIG. 5 is a schematic plan view of a wiring pattern in the first wiring layer 21. The first wiring layer 21 is provided with a high-speed wiring land 20a, a first-layer high-speed wiring 20 connected to the high-speed wiring land 20a, a signal wiring land 22a, and a first-layer signal wiring 22b connected to the signal wiring land 22a, a land for power supply X and a land for ground Y. Each wiring connects the first wiring layer 21, the second wiring layer 23, and the third wiring layer 24 through a via 28. In a portion I, a high-speed wiring is connected to the second wiring layer 23 from the high-speed wiring land 20a through the via. In a portion II, the first-layer high-speed wiring 20 extends from the high-speed wiring land 20a, and the high-speed wiring is connected to the second wiring layer 23 through the via 28. Solder bumps or the like are formed on the high-speed wiring land 20a, the signal wiring land 22a, the land for power supply X, and the land for ground Y, and are connected to an external device (not illustrated).

Figure 6:
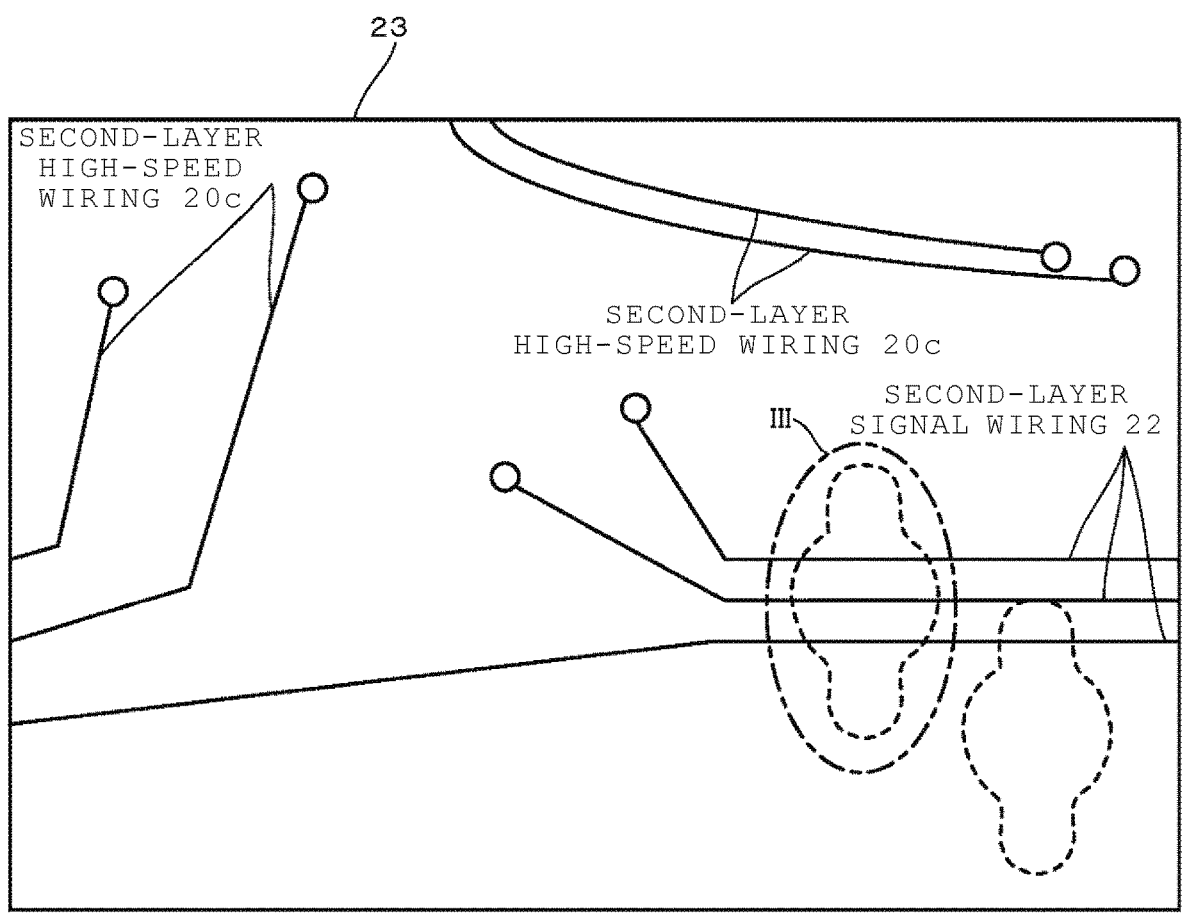
FIG. 6 is a schematic plan view of a wiring pattern of a second wiring layer of the wiring board according to at least one embodiment.

FIG. 6 is a schematic plan view of a wiring pattern in the second wiring layer 23. The second wiring layer 23 is provided with a second-layer high-speed wiring 20c and a second-layer signal wiring 22. Each wiring is connected to the first wiring layer 21 through a via. As can be seen by looking at a place surrounded by one dot chain line III, there is a place where the high-speed wiring land 20a and the second-layer signal wiring 22 overlap.

As illustrated in FIGS. 2 and 3, the third wiring layer 24 is provided with a power supply wiring 25 and a ground wiring 26. The power supply wiring 25 is on the first wiring layer 21 side and the ground wiring 26 is disposed over the power supply wiring 25. Power is supplied to the power supply wiring 25 and the ground wiring 26 through the land for power supply X and the land for ground Y. At least one of the power supply wiring 25 and the ground wiring 26 provided in the third wiring layer 24 is used as a noise shield wiring that shields noise generated between the high-speed wiring land 20a and the second-layer signal wiring 22. In the first wiring layer 21 and the second wiring layer 23, although solid or mesh-shaped power supply wiring and ground wiring are disposed in the portions where wirings and pads are not provided, but are omitted in FIGS. 5 and 6. In at least one embodiment, a case where the ground wiring 26 is used as a noise shield wiring will be described.

In the following, the high-speed wiring will be described.

The high-speed wiring 20 is a high-speed wiring such as peripheral component interconnect express (PCIe), for example, and is a wiring through which a signal having a frequency of, for example, 1 GHz or more flows, and requires impedance control. A signal having a slower frequency than the high-speed wiring flows through the signal wiring. The high-speed wiring land 20a has a diameter larger than a line width of the first-layer high-speed wiring 20, and is a conductor part occupying a large area. The first-layer high-speed wiring 20 and the second-layer high-speed wiring 20c are a pair of two wirings, and wiring patterns thereof are similar to each other. The high-speed wiring is preferably used in pairs. For example, the high-speed wiring 20 is connected only to the first semiconductor chip 3 that needs to exchange signals at high speed. For example, the high-speed wiring 20 includes one that goes out from the signal wiring land 22a and is connected to the first semiconductor chip 3, one that goes out from the signal wiring land 22a and is connected to the third semiconductor chip 6, and one that connects the first semiconductor chip 3 and the third semiconductor chip 6.

As described above, the high-speed wiring land 20a is the conductor part that occupies a large area. For that reason, if a portion of the high-speed wiring land 20a and the ground wiring 26 overlap each other, capacitive coupling therebetween becomes large. Accordingly, as illustrated in FIG. 2, in at least one embodiment, in a portion where the second-layer signal wiring 22 of the upper second wiring layer 23 and the high-speed wiring land 20a do not overlap, the ground wiring 26 that acts as the noise shield wiring is not disposed (removed) between the second-layer signal wiring 22 and the high-speed wiring land 20a.

As illustrated in FIG. 3, in a portion where the second-layer signal wiring 22 of the upper second wiring layer 23 and the high-speed wiring land 20a overlap, the ground wiring 26 that acts as the noise shield wiring is disposed therebetween so as to overlap the second-layer signal wiring 22.

Figure 4:
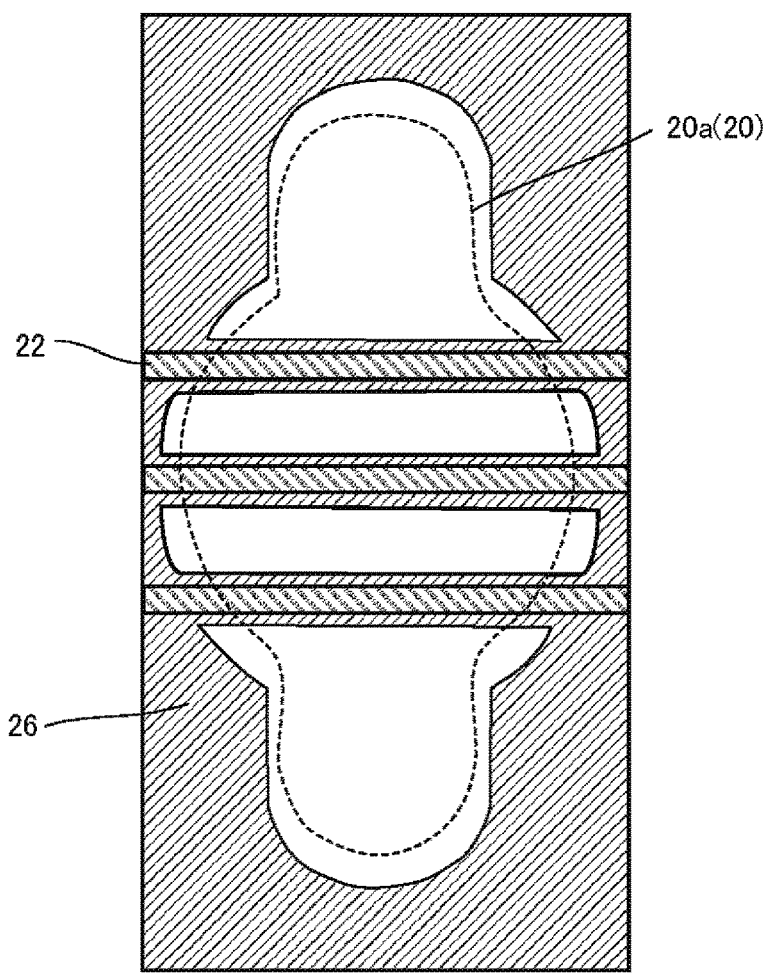
FIG. 4 is a plan view illustrating a configuration of main parts of the wiring board according to at least one embodiment.

FIG. 4 is a schematic diagram illustrating an enlarged perspective view of a portion surrounded by the one dot chain line III in FIG. 6. A portion where the second-layer signal wiring 22 of the second wiring layer 23 and the ground wiring are provided is illustrated. An outer shape of the high-speed wiring land 20a is illustrated by a dotted line. As described above, between the high-speed wiring land 20a of the first wiring layer 21 and the second-layer signal wiring of the second wiring layer 23, the ground wiring 26 functioning as a noise shield wiring is interposed therebetween. Then, as illustrated in FIG. 4, in the portion overlapping the high-speed wiring land 20a, a region where the ground wiring 26 is not provided is formed corresponding to a shape of the high-speed wiring land 20a. On the other hand, in a portion where the second-layer signal wiring 22 crosses over the high-speed wiring land 20a, in other words, the portion where the high speed wiring land 20a and the second-layer signal wiring 22 overlap, the ground wiring 26 overlaps the second-layer signal wiring 22.

The ground wiring 26 is formed in the same wiring pattern as the wiring pattern of the second-layer signal wiring 22 passing through the high-speed wiring land 20a. For ease of understanding, in FIG. 4, although the line width of the second-layer signal wiring 22 is drawn to be narrower than the line width of the ground wiring 26, it is generally preferable that the line width of the ground wiring 26 is substantially the same as the line width of the second-layer signal wiring 22. However, the line width of the ground wiring 26 does not necessarily need to be substantially the same as the line width of the second-layer signal wiring 22, and for example, when the line width of the second-layer signal wiring 22 is set to 10, the line width of the ground wiring 26 may be increased by 5 to 15. The line width of the second-layer signal wiring 22 and the like is, for example, about 30 μm to 35 μm.

By increasing the line width of the ground wiring 26, a noise reduction effect between the high-speed wiring land 20a and the second-layer signal wiring 22 is enhanced, but the capacitive coupling between the high-speed wiring land 20a and the ground wiring 26 is increased. On the other hand, by narrowing the line width of the ground wiring 26, the capacitive coupling between the high-speed wiring land 20a and the ground wiring 26 can be reduced, but the noise reduction effect between the high-speed wiring land 20a and the second-layer signal wiring 22 becomes low.

For that reason, as described above, the line width of the ground wiring 26 is between 5 and 15 when the line width of the second-layer signal wiring 22 is set to 10. With this configuration, it is possible to prevent the capacitive coupling between the high-speed wiring land 20a and the ground wiring 26 while reducing the influence of noise between the high-speed wiring land 20a and the second-layer signal wiring 22, and to prevent the deterioration of the electrical characteristics.

The wiring board 2 is configured with an insulating layer and a conductor layer formed on the insulating layer. The insulating layer may be made of an insulating material containing at least any of resin, ceramics, glass, polyimide, and silicon. The conductor layer may be made of any of copper, aluminum, tungsten, gold, and silver, or an alloy containing these.

As described above, in the wiring board 2 and the semiconductor package 1 of at least one embodiment, it is possible to prevent the capacitive coupling while reducing the influence of noise between the wiring layers.

Actually, the semiconductor package 1 using the wiring board 2 of at least one embodiment, in which a region where the ground wiring 26 is not provided is formed corresponding to the shape of the high-speed wiring land 20a in the portion overlapping the high-speed wiring land 20a. The ground wiring 26 having the same line width as the second-layer signal wiring 22 overlaps the second-layer signal wiring 22 in the portion where the high-speed wiring land 20a and the second-layer signal wiring 22 overlap, was created. On the other hand, the semiconductor package 1 using the wiring board 2 of a comparative example, in which the ground wiring 26 is uniformly (solidly) provided also in the portion overlapping the high-speed wiring land 20a, was created. Then, electric performances of these semiconductor packages 1 were compared.

In the comparison of the electrical performances described above, Return Loss, reference clocks (REFCLK) in Differential mode and Common mode were measured and compared at frequencies of 50 MHz to 2.5 GHz and 2.5 GHz to 8 GHz.

As a result, with the reference clock in the differential mode, the results of the example were better than those of the comparative example for which measurement results of −0.58 dB at 50 MHz to 2.5 GHz and −0.48 dB at 2.5 GHz to 8 GHz are obtained. With the reference clock in the common mode, the results of the example were better than those of the comparative example for which measurement results of −0.39 dB at 50 MHz to 2.5 GHz and −0.28 dB at 2.5 GHz to 8 GHz are obtained.

OTHER EMBODIMENTS (a) Although the ground wiring 26 is used as a shield in the embodiment described above, the power supply wiring 25 may be used as the shield. Alternatively, both the power supply wiring 25 and the ground wiring 26 may be used as the shield.

(b) Although the ground wiring 26 is located on the power supply wiring 25 in at least one embodiment described above, the power wiring 25 may be located on the upper side and the ground wiring 26 may be located on the lower side.

(c) Although the ground wiring 26 or the power supply wiring 25 shields the high-speed wiring land 20*a* in the embodiment described above, the signal wiring land 22*a* may be shielded.

(d) As illustrated in FIGS. 2 and 3, the ground wiring 26 is located on the power supply wiring 25, and the power supply wiring 25 and the ground wiring 26 are provided in pseudo two layers in at least one embodiment described above. However, the power supply wiring 25 and the ground wiring 26 may be provided in the same layer.

While certain embodiments have been described, these embodiments have been presented by way of example only, and are not intended to limit the scope of the disclosure. Indeed, the novel embodiments described herein may be embodied in a variety of other forms. Furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A wiring board comprising:
a first wiring layer including a first land for transmitting a first signal, a second land for transmitting a second signal different from the first signal, and a third land for transmitting a third signal different from the first signal and the second signal;
a second wiring layer including a first signal line provided from the first land and a second signal line provided from the second land;
a third wiring layer disposed between the first wiring layer and the second wiring layer and including a power supply wiring and/or a ground wiring,
wherein when viewed from a plan view, a first portion of the power supply wiring and/or the ground wiring is disposed across the third land and overlaps the third land,
when viewed from the plan view, a second portion of the power supply wiring and/or the ground wiring disposed across the third land, overlaps the third land, and (a) the second portion being physically separated from the first portion on the third land, and (b) the second portion is in a same layer as the first portion,
when viewed from the plan view, the first portion and the first signal line overlap each other over the third land, and the second portion and the second signal line overlap each other over the third land.

2. The wiring board according to claim 1, wherein the first signal line is configured to be a wiring through which a signal having a frequency of 1 GHz or more is transmitted.

3. The wiring board according to claim 1, wherein a line width of the power supply wiring and/or the ground wiring is 5 to 15 units when a line width of the second signal line is 10 units, in the second portion where the third land and the second signal line overlap.

4. The wiring board according to claim 1, wherein a wiring of the third wiring layer arranged to provide noise shielding between the first wiring layer and the second wiring layer is the ground wiring.

5. The wiring board according to claim 1, wherein a wiring of the third wiring layer arranged to provide noise shielding between the first wiring layer and the second wiring layer is the power supply wiring.

6. The wiring board according to claim 1, further comprising:
an insulating layer including an insulating material containing at least one of resin, ceramic, glass, polyimide, silicon oxide, or silicon nitride, and
a conductor layer including an alloy containing at least one of copper, aluminum, tungsten, gold, or silver.

7. A semiconductor device comprising:
a first semiconductor chip provided on the wiring board according to claim 1;
a first resin layer provided on the first semiconductor chip; and
a second semiconductor chip provided on the first resin layer,
wherein the first signal line is connected to the first semiconductor chip.

8. The semiconductor device according to claim 7, wherein
the first semiconductor chip is a controller chip, and
the second semiconductor chip is a semiconductor memory chip.

9. The semiconductor device according to claim 7, wherein the second semiconductor chip includes a spacer substrate.

10. The semiconductor device according to claim 7, further comprising at least one third semiconductor chip disposed above the first semiconductor chip.

11. The semiconductor device according to claim 10, wherein the at least one third semiconductor chip includes a plurality of stacked semiconductor chips.

12. The semiconductor device according to claim 10, wherein the first semiconductor chip is configured to control the at least one third semiconductor chip.

13. The semiconductor device according to claim 10, wherein an outer profile of the first semiconductor chip is smaller than that of the at least one third semiconductor chip.

14. The wiring board according to claim 1, wherein:
the second wiring layer includes a third signal line provided from the third land;
wherein the first signal line and the third signal line are pair wirings.

15. The wiring board according to claim 1, the first signal is faster than the second signal.

16. The wiring board according to claim 1, wherein when viewed from the plan view, a shape of the first portion of the power supply wiring and/or the ground wiring is linear and a shape of the second portion of the power supply wiring and/or the ground wiring is linear.

17. The wiring board according to claim 1, wherein the first portion of power supply wiring and/or the ground wiring and the second portion of the power supply wiring and/or the ground wiring are parallel in a same layer.

* * * * *